United States Patent [19]

Rinehart

[11] Patent Number: 5,405,547
[45] Date of Patent: Apr. 11, 1995

[54] NON-CHLORINATED CLEANER-DRIER

[75] Inventor: William M. Rinehart, Centralia, Mo.

[73] Assignee: Hubbell Incorporated, Orange, Conn.

[21] Appl. No.: 230,411

[22] Filed: Apr. 19, 1994

Related U.S. Application Data

[63] Continuation of Ser. No. 950,455, Sep. 24, 1992, abandoned.

[51] Int. Cl.$^6$ .................... C11D 7/26; C11D 7/50; B08B 3/20; C09K 3/18
[52] U.S. Cl. .................... 252/170; 134/40; 134/42; 252/162; 252/194; 252/364
[58] Field of Search ............... 252/162, 170, 194, 364; 134/40, 42

[56] References Cited

U.S. PATENT DOCUMENTS

| | | | |
|---|---|---|---|
| 3,870,536 | 3/1975 | Blanco et al. | 106/189 |
| 4,274,884 | 6/1981 | Cartwright | 134/4 |
| 4,322,309 | 3/1982 | Rinehart | 252/171 |
| 4,968,447 | 11/1990 | Dixon et al. | 252/174.23 |
| 5,122,510 | 6/1992 | Chen et al. | 505/1 |
| 5,238,504 | 8/1993 | Henry | 134/40 |

FOREIGN PATENT DOCUMENTS

| | | | |
|---|---|---|---|
| 62-202000 | 9/1987 | Japan | 252/170 |
| 133642 | 12/1986 | Poland . | |
| 2033421 | 5/1980 | United Kingdom | 252/170 |

OTHER PUBLICATIONS

Chemical Abstracts No. CA 111:119024m abstract of PL 133,642 (Dec. 1986) (Chemical Abstract published Oct. 1989).

Chemical Abstracts No. CA 113:80586k abstract of CN 1,034,745 (Aug. 1989) (chemical abstract published Sep. 1990).

Union Carbide Material Safety Data-Sheet; Aug. 22, 1990; Diacetone alcohol.

Genium Publishing Corporation; Material Safety Data Sheet; Nov. 1988; Diacetone.

D-Limonene Product Data Sheet; Feb. 15, 1991; Florida Chemical Company.

Florida Chemical Company; Sep. 20, 1990; The Safety, Toxicology and Biodegradation of d-Limonene.

Florida Chemical Co., Inc.; Material Safety Data Sheet; D-Limonene.

Gould, et al.; Mutagens and Carcinogens in the Diet, pp. 255–268, 1990.

*Primary Examiner*—Linda Skaling

[57] ABSTRACT

Improved cleaner-drier compositions completely free of environmentally objectionable chlorinated solvents are provided which include a combination of diacetone alcohol and a terpene fraction such as d-limonene alone or in combination with other terpenes. The diacetone alcohol/-terpene fraction combination should comprise at least about 80% by weight of the overall composition, and the ration of diacetone alcohol to the terpene fraction should be from about 0.4–1.9. The most preferred composition is a 60/40 w/w mixture of diacetone alcohol and d-limonene.

14 Claims, No Drawings

NON-CHLORINATED CLEANER-DRIER

This application is a continuation of application Ser. No. 07/950,455, filed Sep. 24, 1992, now abandoned.

BACKGROUND OF THE INVENTION

1. Field of the Invention

The present invention is broadly concerned with improved cleaner-drier compositions particularly useful for the cleaning and refinishing of electrical equipment and tools used by electrical utilities. More particularly, it is concerned with such cleaner-drier compositions which are completely free of chlorinated solvents while at the same time having enhanced physical properties. The compositions of the invention include diacetone alcohol together with a compatible terpene fraction; additional ingredients such as naptha or mineral spirits can also be used if desired.

2. Description of the Prior Art

Equipment and tools used by electrical utilities often become contaminated with a large variety of materials such as grease, dirt, salt and water. Such equipment and tools thus need to be cleaned and refinished periodically, in order to maintain safe operating conditions. Popular cleaners heretofore used for this purpose have generally included chlorinated solvents such as perchloroethylene and trichloroethane. These solvents do not, however, remove water or wet contamination that may be tightly held on the surface of a well-used tool. Removal of such water is important not only to maximize the electrical integrity of the tool, but also to ensure a good bond when the tool is recoated.

There are of course solvents that can readily remove water, such as alcohol or acetone. These solvents are highly flammable however, having flash points well below 100° F., and thereby present a danger during use. Heretofore known solvents which dissolve water and have flash points greater than 100° F. evaporate far too slowly for practical use as a cleaner-dryer.

A very successful prior composition of this type is described in U.S. Pat. No. 4,322,309. The compositions of this reference generally include alcohol and a chlorinated hydrocarbon such as 1,1,1-trichloroethylene. However, recent and increasingly stringent environmental concerns about the use of chlorinated solvents have engendered a need for an effective, non-chlorinated substitute for such prior compositions.

Accordingly, there is a real and unsatisfied need in the art for an improved cleaner-drier composition having all of the desirable functional characteristics of prior chlorinated solvent compositions, while completely eliminating the deleterious environmental effects of those compositions.

SUMMARY OF THE INVENTION

The present invention overcomes the problems described above and provides an improved cleaning and drying composition especially adapted for the treatment of hot line tools, booms and other equipment commonly used by electrical utilities. Broadly speaking, the compositions of the invention are in the form of essentially single phase, essentially anhydrous mixtures including therein a combination of a diacetone alcohol and a compatible terpene fraction. This diacetone alcohol-terpene fraction combination should comprise at least about 80% by weight of the overall cleaner-drier composition; in preferred forms, the compositions consist essentially of this combination. Moreover, the ratio of diacetone alcohol to the terpene fraction should be from about 0.4 to 1.9.

In preferred forms, the diacetone alcohol/terpene fraction ratio should be from about 1.4–1.6, and most preferably about 1.5, i.e., the diacetone alcohol-terpene fraction combination is advantageously made up of about 60% by weight diacetone alcohol and 40% by weight terpene fraction.

The most preferred terpene for use in the compositions of the invention is d-limonene, although other terpenes such as turpentine may also be used as long as the terpene fraction is compatible with the diacetone alcohol component. Compatibility in this context refers principally to the ability of the terpene to remain in a single phase with the diacetone alcohol; significant phase separation should be avoided.

In terms of functional properties, the compositions of the invention should preferably have a flash point of from about 70°–150° F. and more preferably from about 100°–125° F. The vapor pressure at 20° C. should be in the range of from about 4–50 mm Hg, and more preferably from about 5–15 mm Hg. The water solubility of the compositions would normally range from about 40–80% by weight, and more preferably from about 50–70% by weight. The level of volatile organic compounds in the compositions is advantageously less than about 1,000 g/l, and more preferably less than about 900 g/l. Finally, the boiling point of the compositions should be from about 225°–325° F. and more preferably from about 260°–300° F. An advantage of the compositions hereof is that they will become cloudy once excessive water has been absorbed, thereby giving a visual indication of the need for recleaning.

DETAILED DESCRIPTION OF THE PREFERRED EMBODIMENTS

The most preferred cleaner-drier composition of the invention consists essentially of a mixture of 60% by weight diacetone alcohol, and 40% by weight d-limonene. The diacetone alcohol serves as a solvent for polar, hydrophilic contaminants, and acts as a drying agent to remove surface moisture. The d-limonene acts as a solvent for hydrophobic contaminants such as silicone oils, grease and aliphatic oils. Furthermore, although d-limonene is known to be biodegradable in the presence of water, the diacetone alcohol component serves to take up any water which may be present, thereby protecting d-limonene from biodegradation during storage.

It has been determined that the preferred 60%/40% by weight mixture of diacetone alcohol and d-limonene exhibits a flash point of 111° F.; a vapor pressure at 20° C. of 7.1 mm Hg; an NFPA fire hazard rating of 2; an evaporation rate of 1.6; a density of 0.8973 g/cc; a solubility in water of about 60% by weight; a boiling point of 278° F.; and a volatile organic compound level of 839.3 g/l.

Diacetone alcohol (CAS#123-42-2) is commercially available and has heretofore been used as a solvent for cellulose derivatives, waxes, fats and oils, and in metal cleaning compounds and degreasers.

D-limonene (CAS#5989-27-5) is likewise commercially available and is known to be a biodegradable solvent occurring in nature as the main component of citrus peel oil. D-limonene has been used as a parts cleaner, engine degreaser, tar and asphalt remover, and as a component of many cleaning compositions. It has also been used as a replacement for toxic chlorinated solvents and CFC's. A paper entitled "The Safety, Toxicology, and Biodegradation of D-limonene" dated Sep. 20, 1990, and a data sheet entitled "D-limonene Product Data Sheet" dated Feb. 15, 1991, both distributed by the Florida Chemical Company, Inc. more fully describes the properties and known uses of d-limonene; these are both incorporated by reference herein.

Formulation of the compositions of the invention is achieved by simple mixing of the ingredients, with no special techniques being required. In use, the cleaner-drier compositions are applied to electrical tools or equipment in the usual fashion. Generally, the compositions will take 10-20 minutes to thoroughly dry. Given the fact that the compositions contain essentially no water, they are free of conductive surfactants which would otherwise be applied to the tools and equipment.

As indicated above, other cleaning aids or solvents may be used in the compositions of the invention, so long as the requisite diacetone alcohol-terpene fraction combination is present at a level of at least about 80% by weight. Such optional cleaning aids or solvents may include naptha, mineral spirits, or the like. Here again, use of these optional ingredients is generally accomplished by a simple mixing procedure with the diacetone alcohol and terpene fraction components.

I claim:

1. A composition for cleaning and drying electrical equipment consisting essentially of an essentially single phase, essentially anhydrous mixture of diacetone alcohol and a compatible hydrocarbon terpene fraction which remains in a single phase mixture when combined with said diacetone alcohol, wherein said mixture is about 100% by weight of said composition, the ratio of said diacetone alcohol to said terpene fraction ranging between 0.4 and 1.9 by weight.

2. The composition of claim 1, said ratio being from 1.4-1.6.

3. The composition of claim 1, said terpene being d-limonene.

4. The composition of claim 1, said composition having a flash point of from about 70°-150° F.

5. The composition of claim 1, said composition having a vapor pressure of from about 4-50 mm Hg.

6. The composition of claim 1, said composition having a solubility in water from about 40-80% by weight.

7. The composition of claim 1, said composition having a boiling point of from about 225°-325° F.

8. The composition of claim 1, said composition having a volatile organic compound level of less than about 1000 g/l.

9. The cleaning and drying composition as set forth in claim 1, including said mixture being free of conductive surfactants.

10. The composition of claim 1, said mixture being 100% by weight of said composition.

11. The composition of claim 1, including an additional ingredient selected from the group consisting of naphtha and mineral spirits.

12. A method of cleaning electrical equipment comprising the steps of:

applying to said equipment a cleaning composition consisting essentially of an essentially single phase, essentially anhydrous mixture of diacetone alcohol and a compatible hydrocarbon terpene fraction which remains in a single phase mixture when combined with said diacetone alcohol, wherein said mixture is at least about 80% by weight of said composition, the ratio of said diacetone alcohol to said terpene fraction ranging between 0.4 and 1.9 by weight; and allowing said composition to dry on said equipment.

13. The method of claim 12, including the step of allowing said composition to dry for a period of from about 10-20 minutes.

14. The method of claim 12, said mixture being about 100% by weight of said composition.

* * * * *